United States Patent
Mears et al.

(10) Patent No.: US 9,721,790 B2
(45) Date of Patent: Aug. 1, 2017

(54) METHOD FOR MAKING ENHANCED SEMICONDUCTOR STRUCTURES IN SINGLE WAFER PROCESSING CHAMBER WITH DESIRED UNIFORMITY CONTROL

(71) Applicant: ATOMERA INCORPORATED, Los Gatos, CA (US)

(72) Inventors: Robert J. Mears, Wellesley, MA (US); Nyles Cody, Tempe, AZ (US); Robert John Stephenson, Duxford (GB)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/169,983

(22) Filed: Jun. 1, 2016

(65) Prior Publication Data
US 2016/0358773 A1    Dec. 8, 2016

Related U.S. Application Data

(60) Provisional application No. 62/169,885, filed on Jun. 2, 2015.

(51) Int. Cl.
*H01L 21/02* (2006.01)
*H01L 29/15* (2006.01)
*H01L 29/06* (2006.01)

(52) U.S. Cl.
CPC .... *H01L 21/02507* (2013.01); *H01L 21/0245* (2013.01); *H01L 21/0262* (2013.01);
(Continued)

(58) Field of Classification Search
CPC .......... H01L 21/02507; H01L 21/0262; H01L 21/0245; H01L 29/0649
See application file for complete search history.

(56) References Cited

U.S. PATENT DOCUMENTS

4,485,128 A    11/1984   Dalal et al.
4,590,399 A    5/1986    Roxlo et al.
(Continued)

FOREIGN PATENT DOCUMENTS

EP    0 843 361    5/1998
GB    2 347 520    6/2000
(Continued)

OTHER PUBLICATIONS

Keim et al., Adsorption of atomic oxygen (N20) on a clean Si(100) surface and its influence on the surface state density; A comparision with O2", Surface Science, vol. 180, No. 203, Feb. 1987, pp. 565-598.
(Continued)

*Primary Examiner* — Kyoung Lee
(74) *Attorney, Agent, or Firm* — Allen, Dyer, Doppelt, Gilchrist, P.A. Attorneys at Law

(57) ABSTRACT

A method for processing a semiconductor wafer in a single wafer processing chamber may include heating the single wafer processing chamber to a temperature in a range of 650-700° C., and forming at least one superlattice on the semiconductor wafer within the heated single wafer processing chamber by depositing silicon and oxygen to form a plurality of stacked groups of layers. Each group of layers may include a plurality of stacked base silicon monolayers defining a base silicon portion and at least one oxygen monolayer constrained within a crystal lattice of adjacent base silicon portions. Depositing the oxygen may include depositing the oxygen using an $N_2O$ gas flow.

33 Claims, 12 Drawing Sheets

(52) U.S. Cl.
CPC ........ *H01L 29/0649* (2013.01); *H01L 29/151* (2013.01); *H01L 29/152* (2013.01)

(56) References Cited

U.S. PATENT DOCUMENTS

| | | | |
|---|---|---|---|
| 4,594,603 A | 6/1986 | Holonyak, Jr. | |
| 4,882,609 A | 11/1989 | Schubert et al. | |
| 4,908,678 A | 3/1990 | Yamazaki | |
| 4,937,204 A | 6/1990 | Ishibashi et al. | |
| 4,969,031 A | 11/1990 | Kobayashi et al. | |
| 5,055,887 A | 10/1991 | Yamazaki | |
| 5,081,513 A | 1/1992 | Jackson et al. | |
| 5,216,262 A | 6/1993 | Tsu | |
| 5,357,119 A | 10/1994 | Wang et al. | |
| 5,577,061 A | 11/1996 | Hasenberg et al. | |
| 5,594,567 A | 1/1997 | Akiyama et al. | |
| 5,606,177 A | 2/1997 | Wallace et al. | |
| 5,616,515 A | 4/1997 | Okuno | |
| 5,627,386 A | 5/1997 | Harvey et al. | |
| 5,683,934 A | 11/1997 | Candelaria | |
| 5,684,817 A | 11/1997 | Houdre et al. | |
| 5,994,164 A | 11/1999 | Fonash et al. | |
| 6,058,127 A | 5/2000 | Joannopoulos et al. | |
| 6,255,150 B1 | 7/2001 | Wilk et al. | |
| 6,274,007 B1 | 8/2001 | Smirnov et al. | |
| 6,281,518 B1 | 8/2001 | Sato | |
| 6,281,532 B1 | 8/2001 | Doyle et al. | |
| 6,326,311 B1 | 12/2001 | Euda et al. | |
| 6,344,271 B1 | 2/2002 | Yadav et al. | |
| 6,350,993 B1 | 2/2002 | Chu et al. | |
| 6,376,337 B1 | 4/2002 | Wang et al. | |
| 6,436,784 B1 | 8/2002 | Allam | |
| 6,472,685 B2 | 10/2002 | Takagi | |
| 6,498,359 B2 | 12/2002 | Schmidt et al. | |
| 6,501,092 B1 | 12/2002 | Nikonov et al. | |
| 6,521,549 B1 | 2/2003 | Kamath et al. | |
| 6,566,679 B2 | 5/2003 | Nikonov et al. | |
| 6,608,327 B1 | 8/2003 | Davis et al. | |
| 6,621,097 B2 | 9/2003 | Nikonov et al. | |
| 6,638,838 B1 | 10/2003 | Eisenbeiser et al. | |
| 6,646,293 B2 | 11/2003 | Emrick et al. | |
| 6,673,646 B2 | 1/2004 | Droopad | |
| 6,690,699 B2 | 2/2004 | Capasso et al. | |
| 6,711,191 B1 | 3/2004 | Kozaki et al. | |
| 6,741,624 B2 | 5/2004 | Mears et al. | |
| 6,748,002 B2 | 6/2004 | Shveykin | |
| 6,816,530 B2 | 11/2004 | Capasso et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Krepps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,109,052 B2 | 9/2006 | Mears et al. | |
| 7,123,792 B1 | 10/2006 | Mears et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,535,041 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 8,497,171 B1 | 7/2013 | Wu et al. | |
| 9,275,996 B2 | 3/2016 | Mears et al. | |
| 2002/0094003 A1 | 7/2002 | Bour et al. | |
| 2003/0034529 A1 | 2/2003 | Fitzgerald et al. | |
| 2003/0057416 A1 | 3/2003 | Currie et al. | |
| 2003/0089899 A1 | 5/2003 | Lieber et al. | |
| 2003/0162335 A1 | 8/2003 | Yuki et al. | |
| 2003/0215990 A1 | 11/2003 | Fitzgerald et al. | |
| 2004/0084781 A1 | 5/2004 | Ahn et al. | |
| 2004/0227165 A1 | 11/2004 | Wang et al. | |
| 2004/0262594 A1 | 12/2004 | Mears et al. | |
| 2004/0262597 A1 | 12/2004 | Mears et al. | |
| 2004/0266045 A1 | 12/2004 | Mears et al. | |
| 2004/0266046 A1 | 12/2004 | Mears et al. | |
| 2004/0266116 A1 | 12/2004 | Mears et al. | |
| 2005/0029510 A1 | 2/2005 | Mears et al. | |
| 2005/0032247 A1 | 2/2005 | Mears et al. | |
| 2005/0163692 A1* | 7/2005 | Atanackovic | B82Y 20/00 423/263 |
| 2005/0208715 A1 | 9/2005 | Seo et al. | |
| 2005/0279991 A1 | 12/2005 | Mears et al. | |
| 2005/0282330 A1 | 12/2005 | Mears et al. | |
| 2006/0011905 A1 | 1/2006 | Mears et al. | |
| 2006/0220118 A1 | 10/2006 | Stephenson et al. | |
| 2006/0223215 A1 | 10/2006 | Blanchard | |
| 2006/0226502 A1 | 10/2006 | Blanchard | |
| 2006/0231857 A1 | 10/2006 | Blanchard | |
| 2006/0243964 A1 | 11/2006 | Kreps et al. | |
| 2006/0263980 A1 | 11/2006 | Kreps et al. | |
| 2006/0267130 A1 | 11/2006 | Rao | |
| 2006/0273299 A1 | 12/2006 | Stephenson et al. | |
| 2006/0289049 A1 | 12/2006 | Rao | |
| 2006/0292765 A1 | 12/2006 | Blanchard et al. | |
| 2007/0010040 A1 | 1/2007 | Mears et al. | |
| 2007/0012910 A1 | 1/2007 | Mears et al. | |
| 2007/0015344 A1 | 1/2007 | Mears et al. | |
| 2007/0020833 A1 | 1/2007 | Mears et al. | |
| 2007/0020860 A1 | 1/2007 | Mears et al. | |
| 2007/0063185 A1 | 3/2007 | Rao | |
| 2007/0063186 A1 | 3/2007 | Rao | |
| 2007/0158640 A1 | 7/2007 | Halilov et al. | |
| 2007/0166928 A1 | 7/2007 | Halilov et al. | |
| 2007/0187667 A1 | 8/2007 | Halilov et al. | |
| 2007/0197006 A1 | 8/2007 | Dukovski et al. | |
| 2008/0012004 A1 | 1/2008 | Huang et al. | |
| 2008/0197340 A1 | 8/2008 | Mears et al. | |
| 2009/0072276 A1 | 3/2009 | Inaba | |
| 2009/0267155 A1 | 10/2009 | Izumida et al. | |
| 2010/0270535 A1 | 10/2010 | Halilov et al. | |
| 2011/0074498 A1 | 3/2011 | Thompson et al. | |
| 2011/0215299 A1 | 9/2011 | Rao | |
| 2012/0261716 A1 | 10/2012 | Yanagihara | |
| 2013/0026486 A1 | 1/2013 | Miyoshi et al. | |
| 2013/0240836 A1 | 9/2013 | Lee et al. | |

(56) References Cited

U.S. PATENT DOCUMENTS

| | | | |
|---|---|---|---|
| 2015/0144877 A1* | 5/2015 | Mears | H01L 21/324 257/20 |
| 2015/0144878 A1 | 5/2015 | Mears et al. | |
| 2015/0357414 A1 | 12/2015 | Mears et al. | |
| 2016/0099317 A1 | 4/2016 | Mears et al. | |
| 2016/0149023 A1 | 5/2016 | Mears et al. | |

FOREIGN PATENT DOCUMENTS

| | | |
|---|---|---|
| JP | 61027681 | 2/1986 |
| JP | 61145820 | 7/1986 |
| JP | 61220339 | 9/1986 |
| JP | 62219665 | 9/1987 |
| WO | 96/29728 | 9/1996 |
| WO | 99/63580 | 12/1999 |
| WO | 02/103767 | 12/2002 |
| WO | 2005034245 | 4/2005 |
| WO | 2007011790 | 1/2007 |
| WO | 2008130899 | 10/2008 |
| WO | 2015077580 | 5/2015 |

OTHER PUBLICATIONS

Lau et al., "Evidence that N2O is a stronger oxidizing agent than O2 for both Ta2O5 and bare Si below 1000,o.C and temperature for minimum low-K interfacial oxide for high-K dielectric on Si", Microelectronics and Reliability, Elsevier Science Ltd., vol. 47, No. 203, Feb. 2007, pp. 429-433.
Lucovsky et al, "Low temperature plasma-assisted oxidation and thin-film deposition processes for forming levice-quality SiO"2/Si and composite dielectric-SiO"2/Si heterostructures", Thin Solid Films, Elsevier-Sequoia S.A., vol. 220, No. 1-2, Nov. 1992, pp. 38-44.
Uno et al, "XPS study of the oxidation process of Si(111) via photochemical decomposition of N"2O by an UV excimer laser", Surface Science, vol. 193, No. 3, Jan. 1998, pp. 321-335.
Luo et al., "Chemical Design of Direct-Gap Light-Emitting Silicon", published in Physical Review Letters, vol. 89, No. 7 (Aug. 12, 2002) 4 pgs.
Raphael Tsu "Si Based Green ELD: Si-Oxygen Superlattice" wysiwyg://l/http://www3.interscience.wiley.com/cgi-bin/abstract/72512946/start: published online Jul. 21, 2000; 2 pgs. Abstract Only.
Yu et al., GaAs MOSFET with Oxide Gate Dielectric Grown by Atomic Layer Deposition, Agere Systems, Mar. 2003; 7 pgs.
Novikov et al., Silicon-based Optoelectronics, 1999-2003, pp. 1-6.
Fan et al., N- and P-Type SiGe/Si Superlattice Coolers, the Seventeenth Intersociety Conference on Thermomechanical Phenomena in Electronic Systems (ITherm 2000), vol. 1, pp. 304-307, Las Vegas, NV, May 2000; 4 pgs.
Shah et al., Experimental Analysis and Theoretical Model for Anomalously High Ideality Factors (n>2.0) in AlGaN/GaN P—N. Junction Diodes, Journal of Applied Physics, vol. 94, No. 4, Aug. 15, 2003; 4 pgs.
Ball, Striped Nanowires Shrink Electronics, news@nature.com, Feb. 7, 2002; 2 pgs.
Fiory et al., Light Emission from Silicon: Some Perspectives and Applications, Journal of Electronic Materials, vol. 32, No. 10, 2003; pp. 1043-1051.
Lecture 6: Light Emitting and Detecting Devices, MSE 6001, Semiconductor Materials Lectures, Fall 2004; 4 pgs.
Harvard University Professor and Nanosys Co-Founder, Charlie Lieber, Raises the Stakes in the Development of Nanoscale Superlattice Structures and Nanodevices, Feb. 8, 2002, Nanosys, Inc.; 2 pgs.
Bu, "FINFET Technology, a substrate prospective", IBM Research, PreT0 Alliance, SOI Conference, 2011, pp. 1-28.
Xu et al., "MOSFET performance and scalability enhancement by insertion of oxygen layers", Department of Electrical Engineering and Computer Science, University of California, Berkeley, 2012, pp. 1-4.
R. Tsu "Phenomena in silicon nanostructure devices" published online Sep. 6, 2000 by Applied Physics and Materials Science & Processing, pp. 391-402.
Shinada et al., Nature 437, 1128 (2005)) Retrieved from internet Jun. 19, 2015; 3 pgs.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Liu et al. Threshold Voltage Model for Deep-Submicrometer MOSFET's IEEE Transactions on Electron Devices, vol. 40, No. I, Jan. 1993: pp. 86-95.
Brews et al. "Generalized guide for MOSFET miniaturization" IEEE Electron Device Letters 1(1):2-4 • Jan. 1980.
Damrongplasit et al. "Comparative study of uniform versus supersteep retrograde MOSFET channel doping and Implication for 6-T SRAM yield" IEEE Transactions on Electron Devices, vol. 60, No. 5, May 2013: pp. 1790-1793.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11 2012).
U.S. Appl. No. 15/154,276, filed May 13, 2016.
U.S. Appl. No. 15/154,296, filed May 13, 2016.
U.S. Appl. No. 14/966,312, filed Jan. 15, 2016.

* cited by examiner

METHOD FOR MAKING ENHANCED SEMICONDUCTOR STRUCTURES IN SINGLE WAFER PROCESSING CHAMBER WITH DESIRED UNIFORMITY CONTROL

CROSS-REFERENCE TO RELATED APPLICATIONS

This application claims the benefit of provisional application No. 62/169,885 filed Jun. 2, 2015, which is hereby incorporated herein in its entirety.

TECHNICAL FIELD

The present disclosure generally relates to semiconductor devices and, more particularly, to methods for making enhanced semiconductor structures.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an re-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Despite the advantages provided by such structures, further developments may be desirable for integrating advanced semiconductor materials in various semiconductor devices and for different semiconductor processing configurations.

SUMMARY

A method for processing a semiconductor wafer in a single wafer processing chamber may include heating the single wafer processing chamber to a temperature in a range of 650-700° C., and forming at least one superlattice on the semiconductor wafer within the heated single wafer processing chamber by depositing silicon and oxygen to form a plurality of stacked groups of layers. Each group of layers may include a plurality of stacked base silicon monolayers defining a base silicon portion and at least one oxygen monolayer constrained within a crystal lattice of adjacent base silicon portions. Depositing the oxygen may include depositing the oxygen using an $N_2O$ gas flow.

More particularly, the $N_2O$ gas flow may comprise 0.1% to 10% $N_2O$ in a gas comprising at least one of He and Ar, for example. Also by way of example, depositing the oxygen may include depositing the oxygen with an exposure time in a range of 1 to 100 seconds. In one example embodiment, the $N_2O$ gas flow may be in a range of 10 to 5000 standard cubic centimeters per minute (SCCM). Furthermore, the oxygen may be deposited at a pressure in a range of 10 to 100 Torr, for example. Also by way of example, a total dose of $N_2O$ may be in a range of $1 \times 10^{14}$ to $7 \times 10^{14}$ atoms/cm$^2$ during the oxygen monolayer formation.

In accordance with one example implementation, the semiconductor wafer may include a plurality of spaced apart shallow trench isolation (STI) regions, and forming the at least one superlattice may include selectively forming a respective superlattice between adjacent pairs of STI regions. In accordance with another example, forming the at least one superlattice may comprise a blanket superlattice formation on the semiconductor wafer. Furthermore, at least some silicon atoms from opposing base silicon portions may be chemically bound together through the at least one oxygen monolayer therebetween.

DETAILED DESCRIPTION

Figure 1:
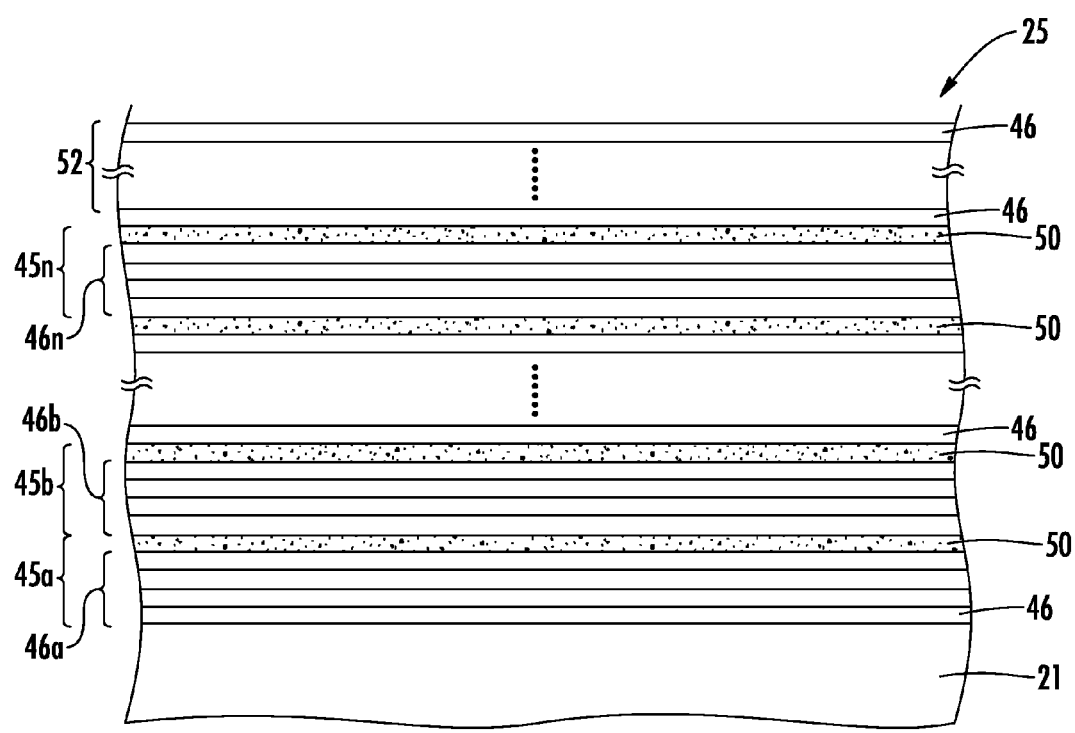
FIG. 1 is a greatly enlarged schematic cross-sectional view of a superlattice for use in a semiconductor device in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in different embodiments.

Generally speaking, the present disclosure relates to enhanced semiconductor devices, particularly those incorporating advanced semiconductor materials such as the superlattice 25 described further below, and associated fabrication techniques. Applicant has established by atomistic simulation and experimental verification (SIMS) that electrical dopants such as boron and arsenic have an energetic minimum close to (e.g., typically one silicon bond removed from) an oxygen (or CO or N, etc.) atomic layer(s) in the superlattice 25, and preferentially accumulate in this position under thermal diffusion. Following the description of example superlattice structures below, techniques for enhanced deterministic doping of the superlattice 25 are also provided. However, it should be noted that the techniques set forth herein may also be used for other semiconductor layers and structures as well in addition to the noted superlattices, as will be appreciated by those skilled in the art.

Applicants theorize, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicants use a "conductivity reciprocal effective mass tensor", $M_e^{-1}$ and $M_h^{-1}$ for electrons and holes respectively, defined as:

$$M_{e,i,j}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,i,j}^{-1}(E_F, T) =$$

$$-\frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicants' definition of the conductivity reciprocal effective mass tensor is such that a tensorial component of the conductivity of the material is greater for greater values of the corresponding component of the conductivity reciprocal effective mass tensor. Again Applicants theorize without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicants have identified improved materials or structures for use in semiconductor devices. More specifically, the Applicants have identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
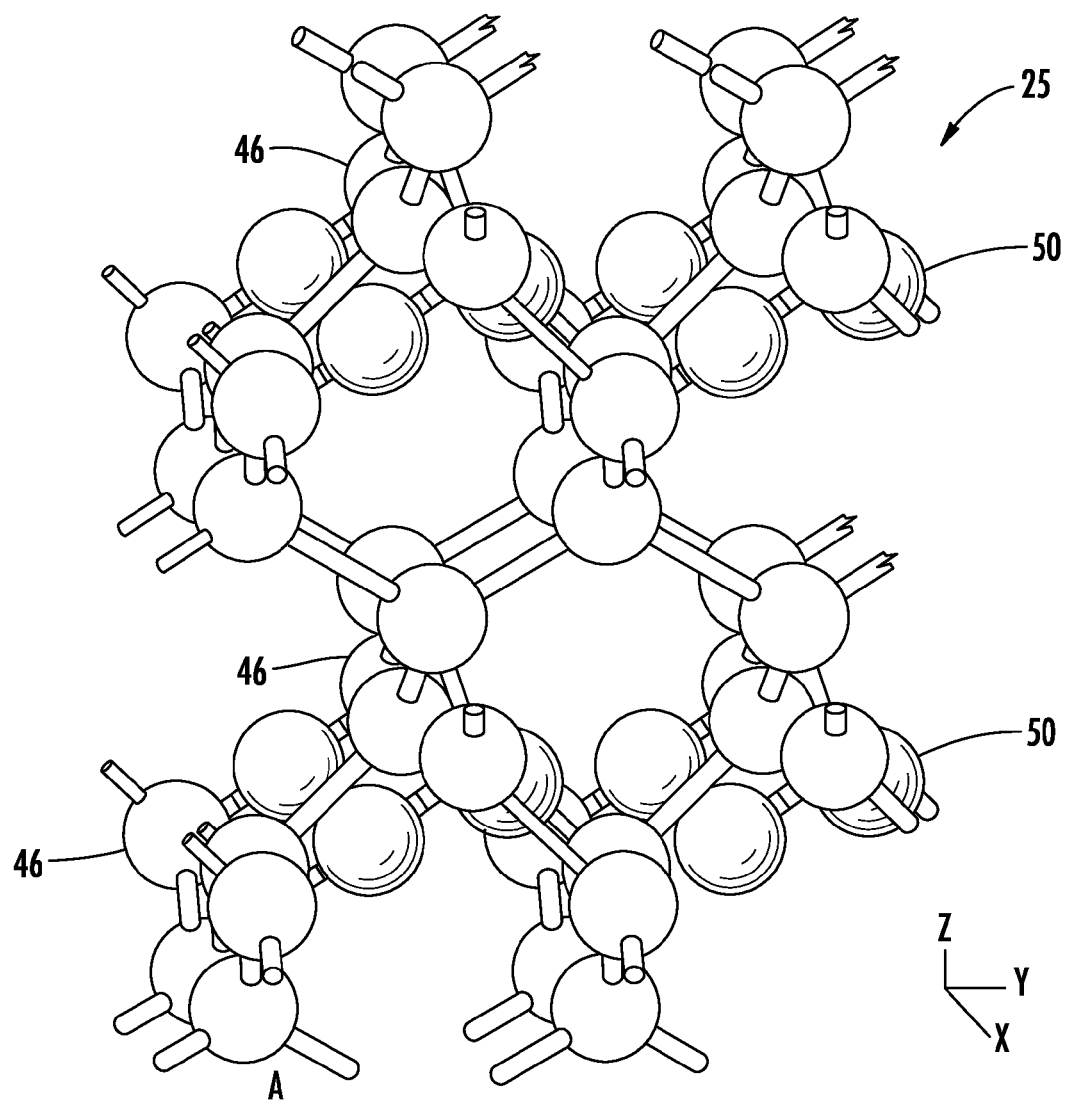
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicants theorize without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicants wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
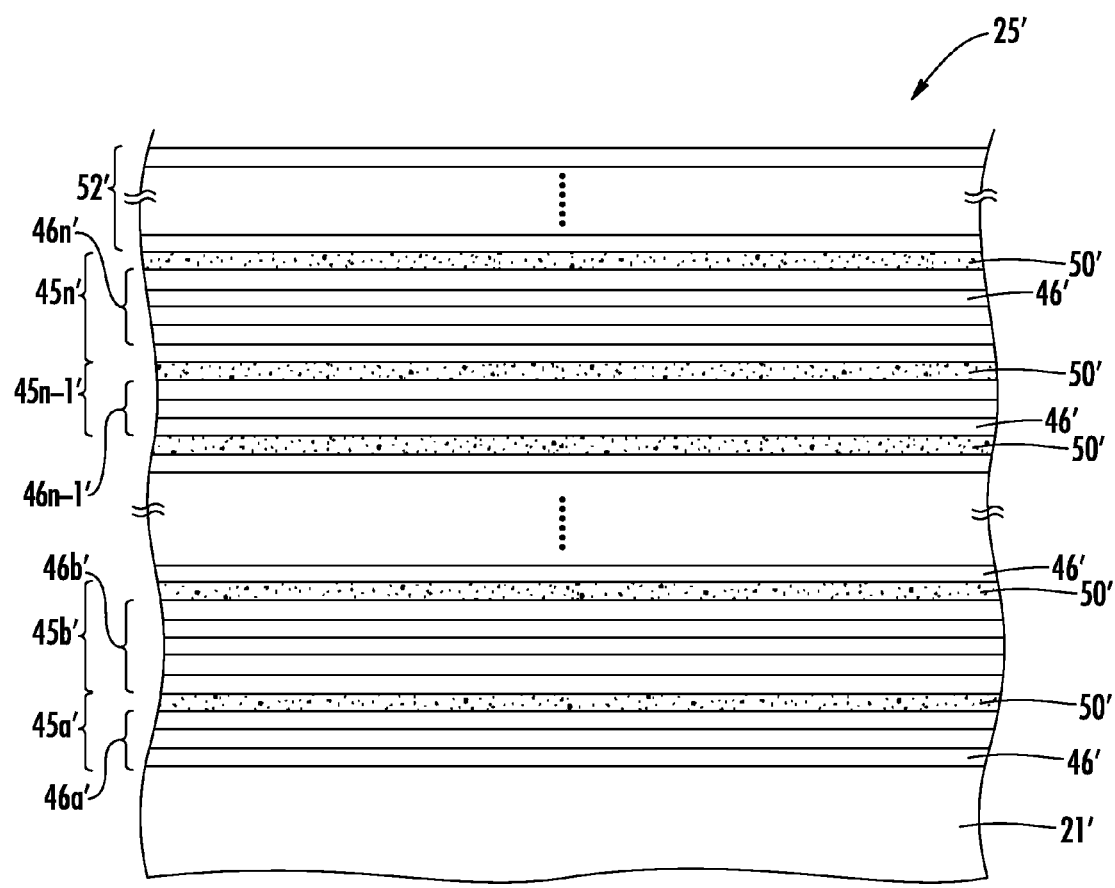
FIG. 3 is a greatly enlarged schematic cross-sectional view of another embodiment of a superlattice in accordance with the invention.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
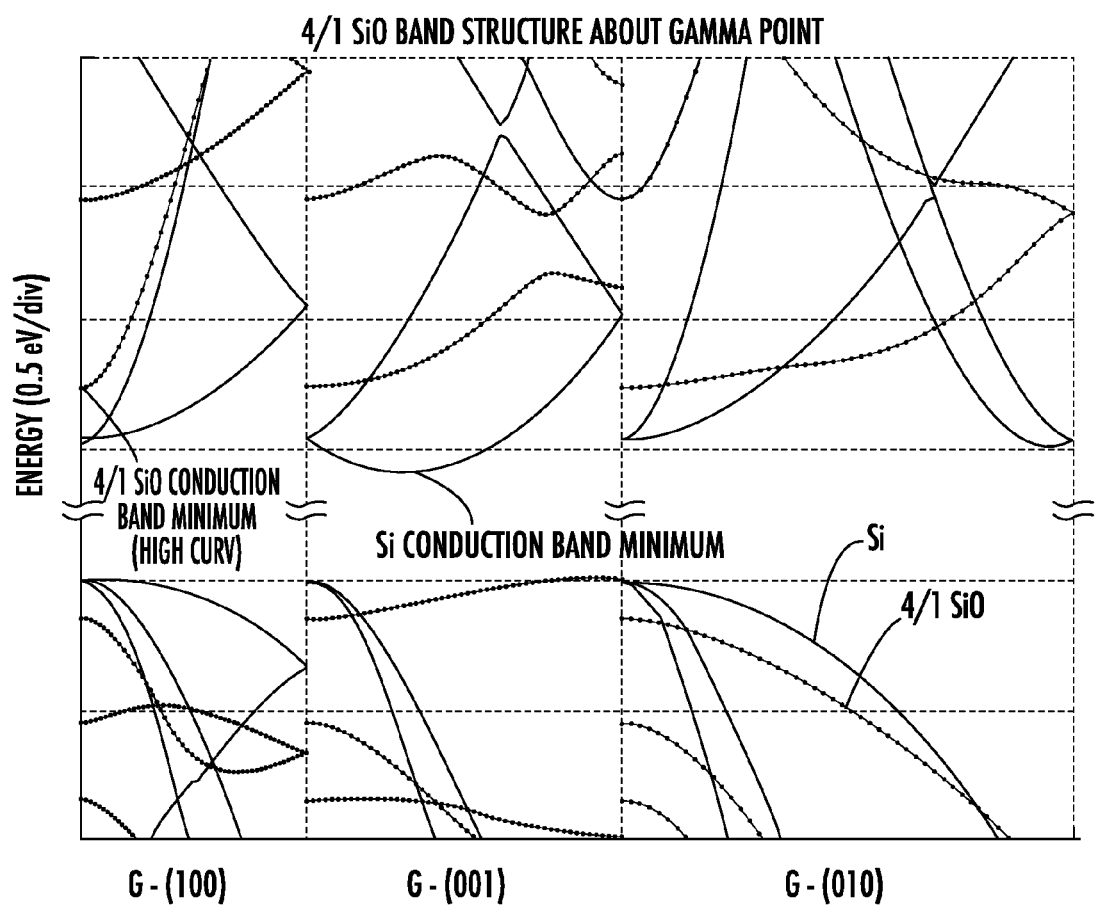
FIG. 4A is a graph of the calculated band structure from the gamma point (G) for both bulk silicon as in the prior art, and for the 4/1 Si/O superlattice as shown in FIGS. 1-2.
Figure 4B:
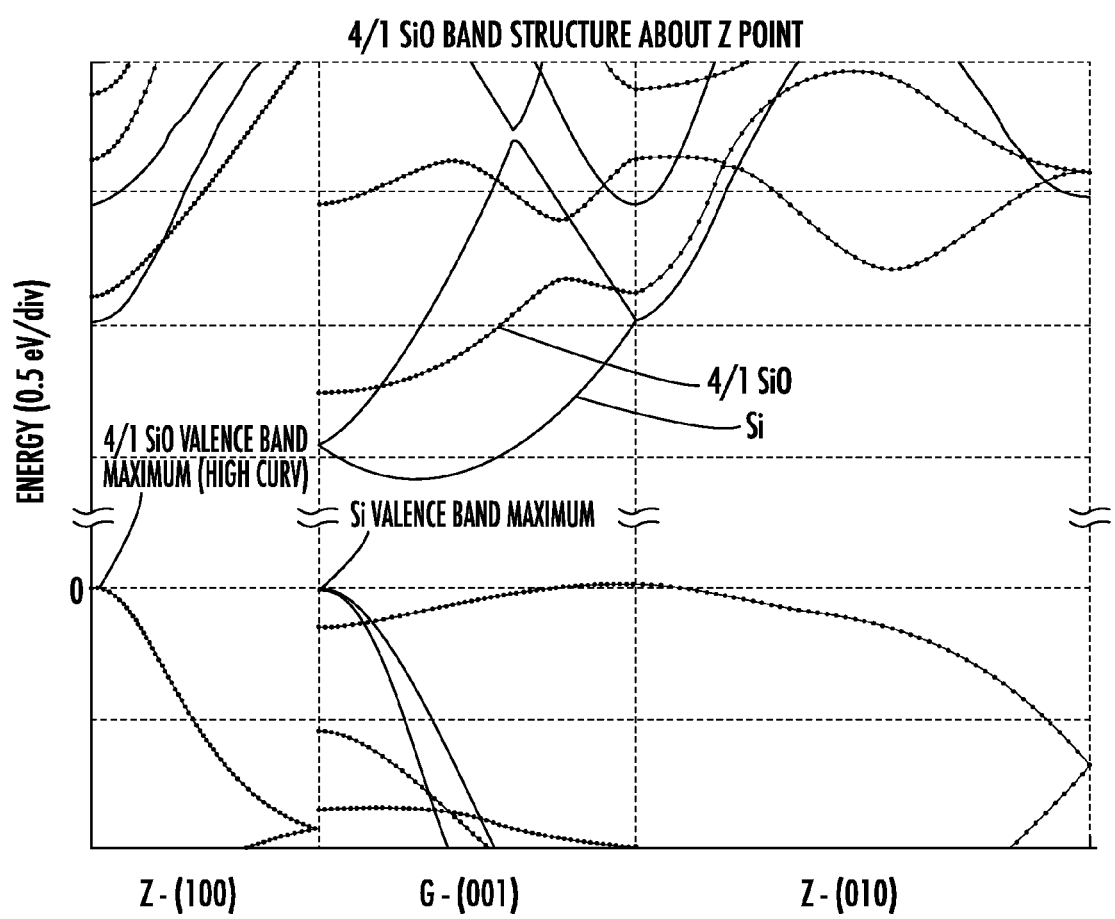
FIG. 4B is a graph of the calculated band structure from the Z point for both bulk silicon as in the prior art, and for the 4/1 Si/O superlattice as shown in FIGS. 1-2.
Figure 4C:
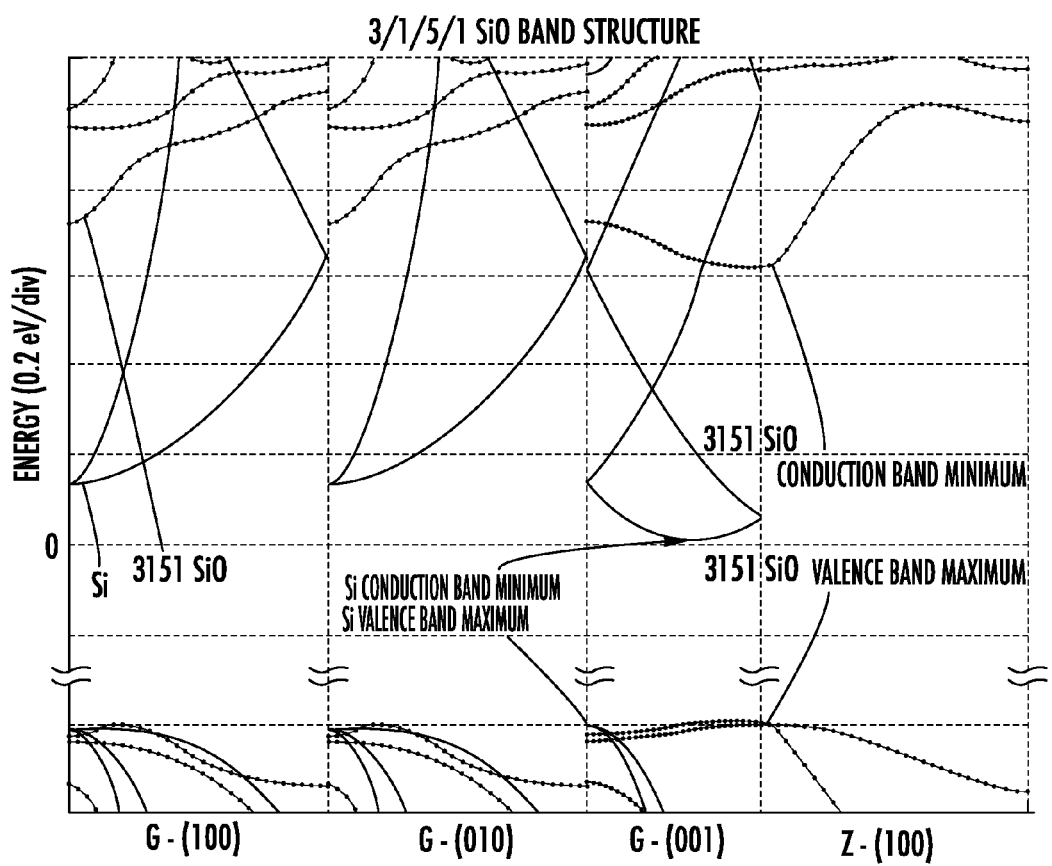
FIG. 4C is a graph of the calculated band structure from both the gamma and Z points for both bulk silicon as in the prior art, and for the 5/1/3/1 Si/O superlattice as shown in FIG. 3.
Figure 5:
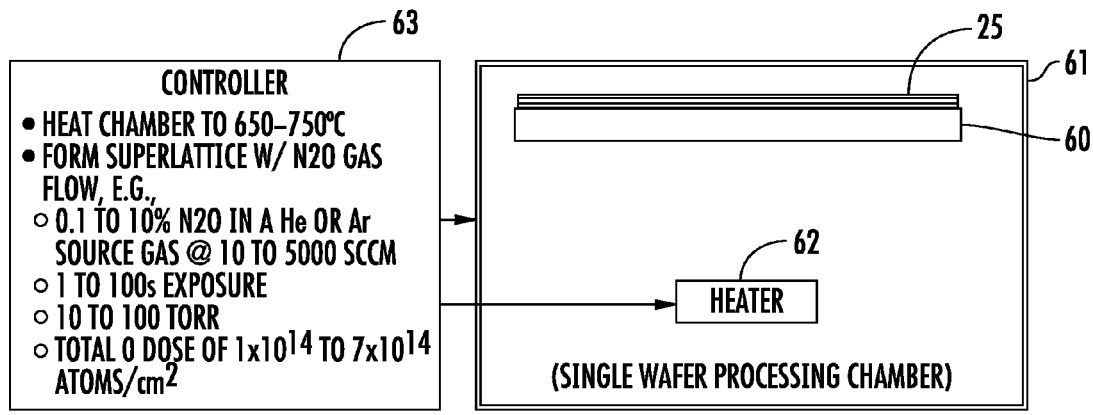
FIG. 5 is a schematic block diagram of a single wafer processing chamber for superlattice formation using an $N_2O$ gas flow in accordance with an example embodiment.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (-110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicants to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Turning to FIGS. 5-11, example approaches for fabricating band-engineered structures or films such as those described above using an $N_2O$ oxygen delivery system in both single wafer (FIG. 5) and batch (FIG. 6) processing chambers to enhance yield are now described. In the single wafer approach, a semiconductor (e.g., silicon) wafer 60 may be inserted in a single wafer chamber 61 which illustratively includes a heater or heating element(s) 62. Moreover, a controller 63 may control the heater 62, gas flow, and other operations within the chamber 61 during processing to perform a blanket superlattice 25 deposition on the wafer 60. That is, the superlattice 25 is formed across the entire upper surface of the wafer 60. However, in some embodiments a selective deposition approach may be used, in which superlattice 25 layers or films are selectively formed on active areas of the wafer 60 after shallow trench isolation (STI) region formation, as will be discussed further below with respect to FIG. 6. Either blanket or selective superlattice deposition may be performed in the single wafer chamber 61 using the techniques described herein.

One example single wafer chamber 61 is a single wafer Advanced Semiconductor Materials (ASM) chamber in which operation at a reduced pressure (RP) may be achieved, e.g., in a range of 10 T to 100 T, and more particularly about 19 T-40 T. By way of comparison, in a typical approach for making an Si/O superlattice 25, a 1% $O_2$ gas flow in a He gas source may be used in the ASM processing chamber. In an example embodiment, an $N_2O$ oxygen source in used instead of $O_2$. More particularly, the controller 63 may provide for a $N_2O$ gas flow in a range of 0.1% to 10%, and more particularly around 1%, in a He or Ar gas source as a replacement to the above-noted $O_2$ gas flow. Generally speaking, $N_2O$ is less reactive than $O_2$, and accordingly may be advantageous in some applications to help control the fabrication process, as will be discussed further below.

Example processing parameters will now be described for using the above-noted $N_2O$ gas flow in the single wafer chamber 61. The chamber may be heated to a temperature in a range of 650 to 700° C., for example. Applicants have determined that below 650° C., little or no oxygen will be incorporated into an Si/O superlattice film 25 with the $N_2O$ gas flow. Moreover, above 700° C., oxygen may be incorporated but silicon growth post oxygen deposition may be reduced, presumably because a different state of incorporation is starting to dominate. In the selective deposition approach, for example, $SiO_2$ may be formed on the surface, which results in the lower Si growth rate.

Furthermore, the $N_2O$ gas flows may range from 10 to 5000 SCCM, and more particularly about 80 to 195 SCCM, and dose times may be in a range from 10 to 100 seconds, and more particularly about 12 to 24 seconds, for example. This may correspond to a total dose of about $1 \times 10^{14}$ to $7 \times 10^{14}$ atoms/cm$^2$, as shown in the plot line 81 of the graph 80 of FIG. 7, which is for a 680° C. single wafer process. By way of comparison, the plot line 82 corresponds to an $O_2$ gas flow, which only requires a three second exposure time due to the greater reactivity than $N_2O$. It may be seen that the twelve second $N_2O$ exposure is 4× longer, and the tuning curve is flatter. In this comparison, adjustments were made to the overall process pressure to get one point 83 (while keeping temperature, time, and flow rates the same as the point below it) for $N_2O$ that centered the process around $1 \times 10^{15}$ atoms/cm$^2$. Applicant theorizes, without wishing to be bound thereto, that dose retention and pile up results may be similar for superlattice films having oxygen monolayers deposited using $N_2O$ to those with oxygen layers deposited using $O_2$ gas flows.

Figure 6:
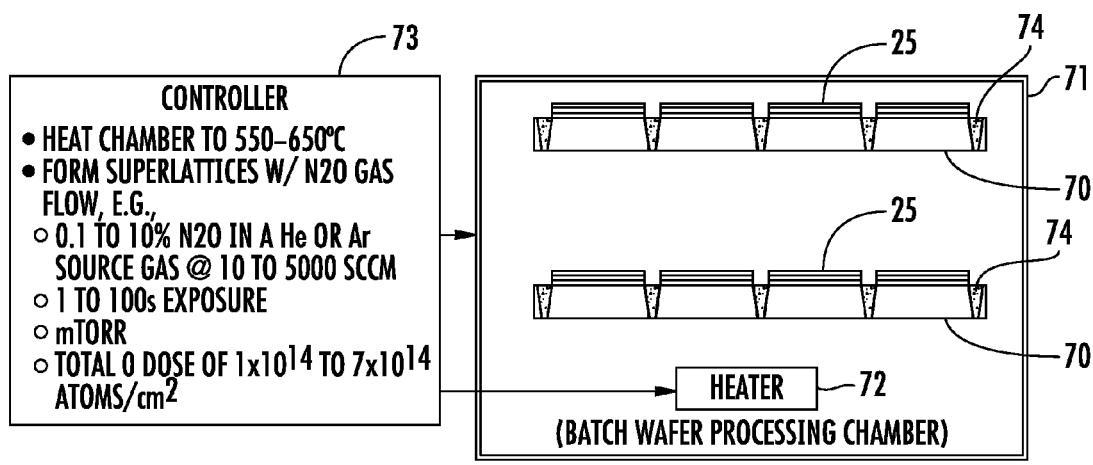
FIG. 6 is a schematic block diagram of a batch wafer processing chamber for superlattice formation using an $N_2O$ gas flow in accordance with another example embodiment.
Figure 7:
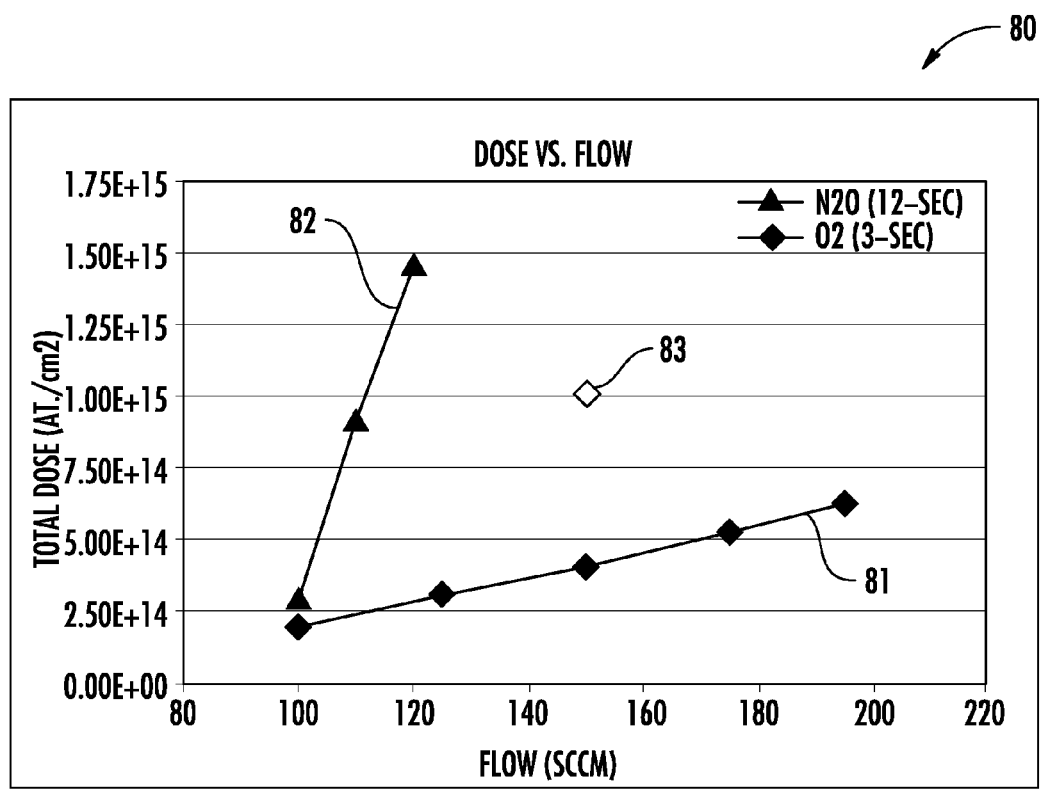
FIG. 7 is a graph of total dose vs. flow for an $O_2$ oxygen deposition approach and for an $N_2O$ oxygen deposition approach in accordance with an example embodiment in a single wafer processing chamber.

In the example of FIG. 6, a plurality of wafers 70 are processed in a batch reactor 71 with a heater 72. Here again, a controller 73 illustratively controls the heater 72, the gas flow, etc., during batch processing to form superlattices 25 on the wafers 70. In the illustrated example, a selective process is performed in which respective superlattices are formed between adjacent STI regions 74 in the wafers 70, as noted above, although a blanket film deposition may also be performed in different embodiments.

By way of example, such batch processing of semiconductor devices or wafers including the above-described structures may be performed using the Batch Epitaxial System (BES) from Hitachi Kokusai Electric (HKE), Inc. of Tokyo, Japan. The BES operates in the mTorr regime, and is a large furnace design. By way of example, an example batch may include 50 to 125 semiconductor wafers, although other numbers of wafers may be processed in different embodiments. Moreover, different processing chambers may be used in addition to the example chambers referenced herein.

While $N_2O$ is advantageously less reactive than $O_2$ and may therefore help with controlling the batch fabrication process (to get better uniformity), various processing parameters may be selected to allow the $N_2O$ to be sufficiently reactive to allow formation of the above-described superlattice films. For example, temperature may be increased to get an oxygen source to react, yet without making it so high that the oxygen either desorbs before the next silicon layer is put down, or the oxygen bonds in a different configuration ($SiO_2$) and prevents the restart of silicon epitaxial growth altogether. Generally speaking, batch processing at lower pressure makes the gases more reactive, and thus the above-noted parameters provided for the single wafer processing may be used for batch processing, but with temperatures translated down to 550-600° C. to provide comparable reactivity in a mTorr regime. Both the single wafer and batch processing may be selective or non-selective using dichlorosilane (DCS), for example. The DCS may be used at the higher temperatures and is selective with the addition of HCl. However, other temperature ranges may be used in different configurations.

Figure 8:
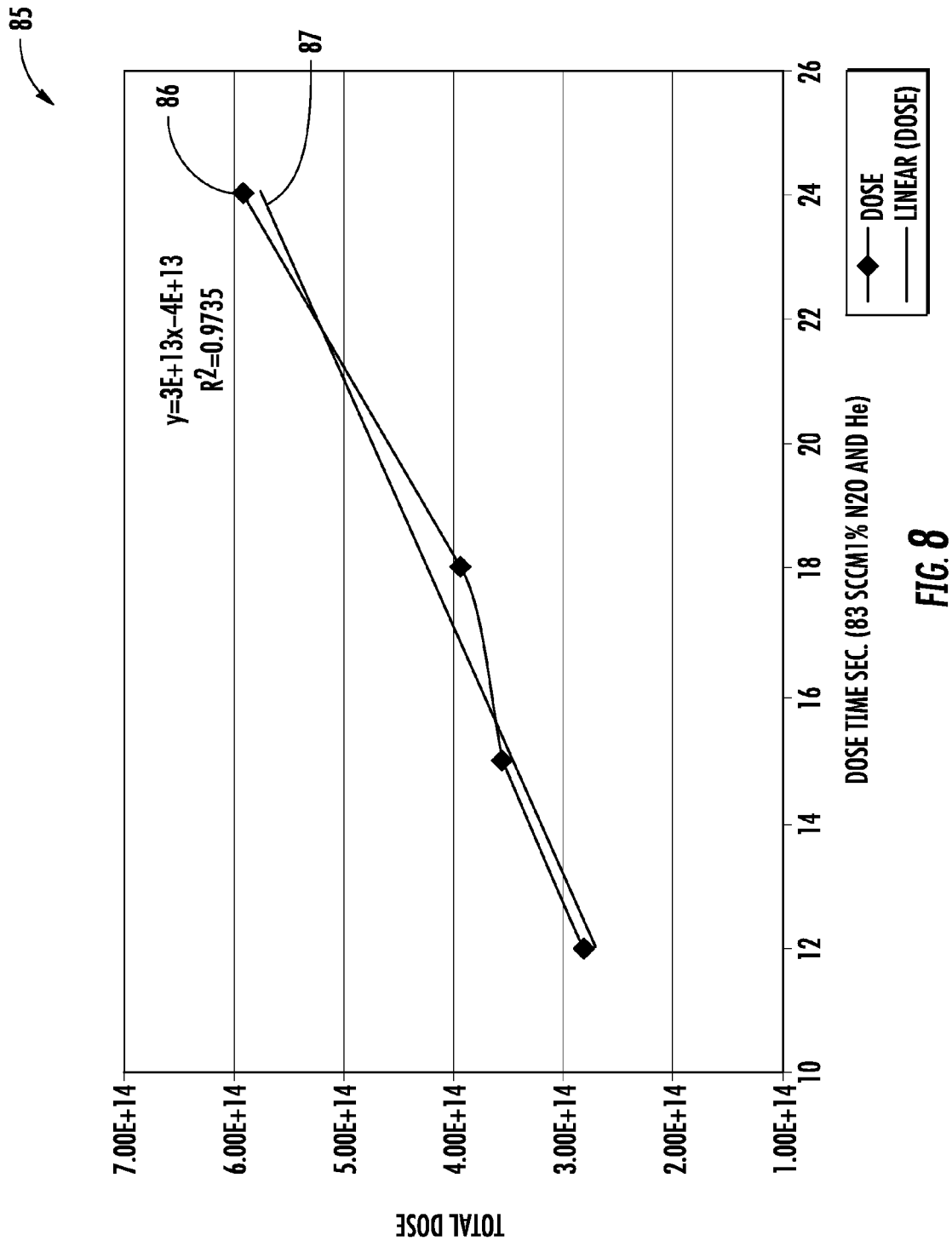
FIG. 8 is a graph of total dose vs. time for an $N_2O$ oxygen deposition approach in accordance with an example embodiment in a single wafer processing chamber.

In the graph 85 of FIG. 8, total dose vs. time for a 1% $N_2O$ gas flow in an ASM single wafer chamber is represented by the plot 86 for a 650° C. deposition and 83 SCCM. From the reference plot 87 may be seen that the total dose is essentially linear. By way of comparison, on this scale oxygen would be at $1 \times 10^{15}$ atoms/cm$^2$ for an exposure down at 3 seconds.

Figure 9:
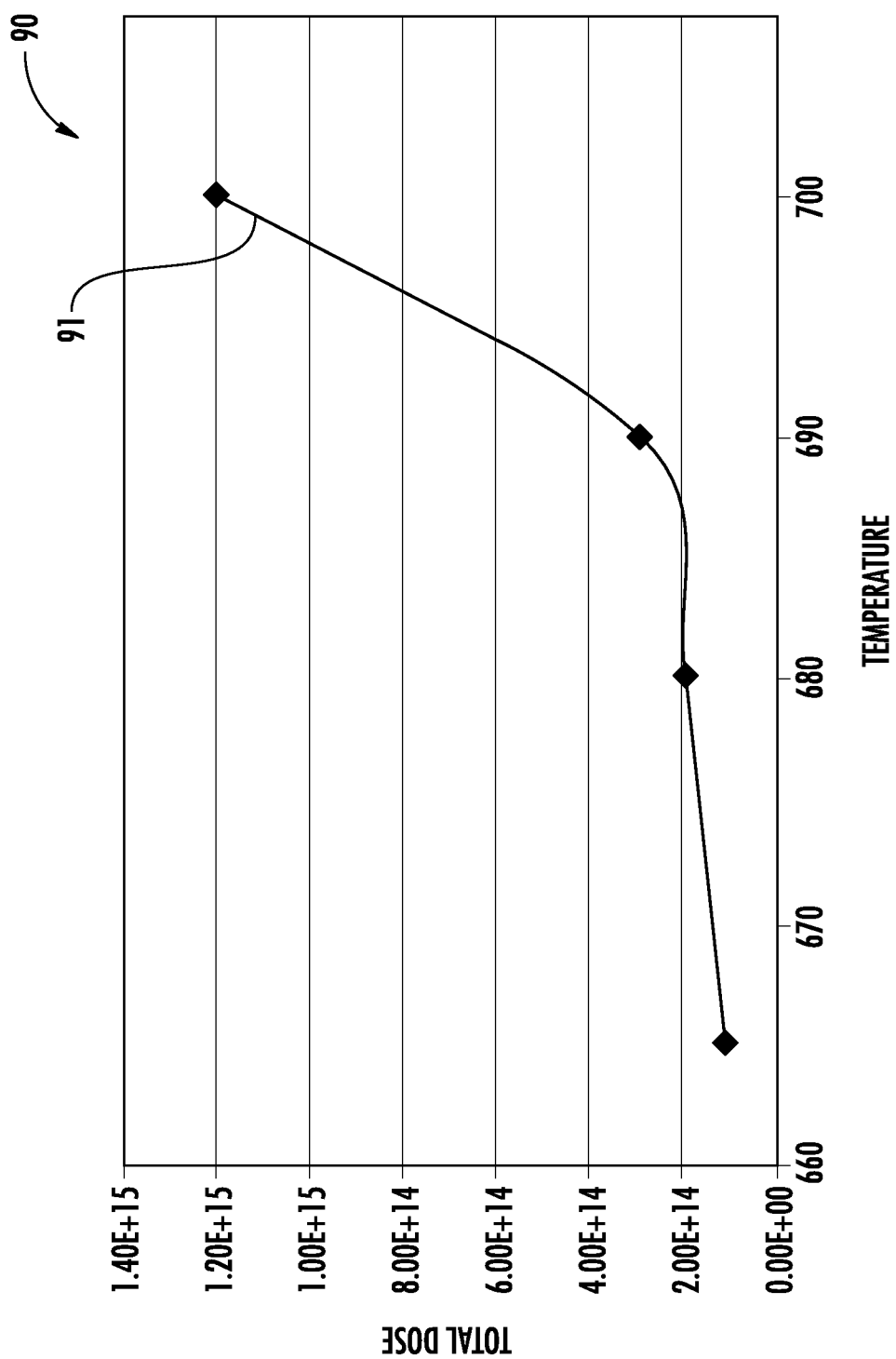
FIG. 9 is graph of total dose vs. temperature for an $N_2O$ oxygen deposition approach in accordance with an example embodiment in a single wafer processing chamber.

In the graph 90 of FIG. 9, total dose vs. temperature is illustrated by the plot 91 for the 1% $N_2O$ gas flow in a single wafer chamber. As noted above, oxygen incorporation is not repeatable near (and below) 650° C. (i.e., no $N_2O$ decomposition), and is unstable above 700° C. (i.e., there is a change in oxygen bonding to silicon) for the ASM single wafer platform.

Figure 10:
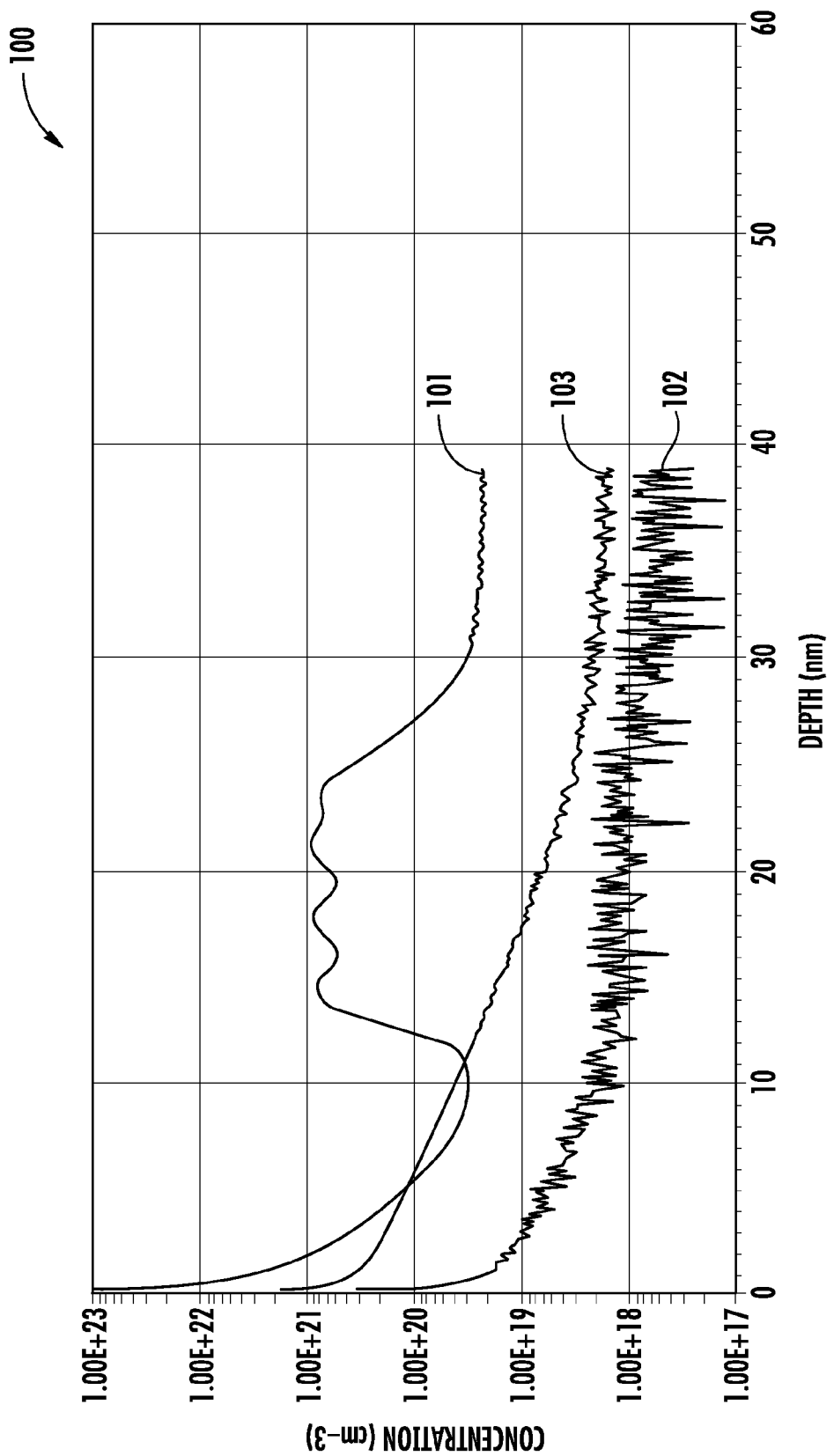
FIGS. 10 and 11 are graphs illustrating concentrations vs. depth for selective superlattice depositions in a single wafer processing chamber in accordance with example embodiments for different STI spacings.

Referring additionally to FIG. 10, the graph 100 illustrates concentrations vs. depth for a selective superlattice deposition (i.e., between adjacent STI regions) with a relatively wide spacing using 30 Å spacers and grown using $N_2O$ in the single wafer ASM chamber. In the illustrated example, oxygen concentration is represented by the plot 101, SiN concentration is represented by the plot 102, and carbon-12 is represented by the plot line 103. For this example, an $N_2O$ exposure for 12 seconds at 680° C. and 170 SCCM was used.

Figure 11:
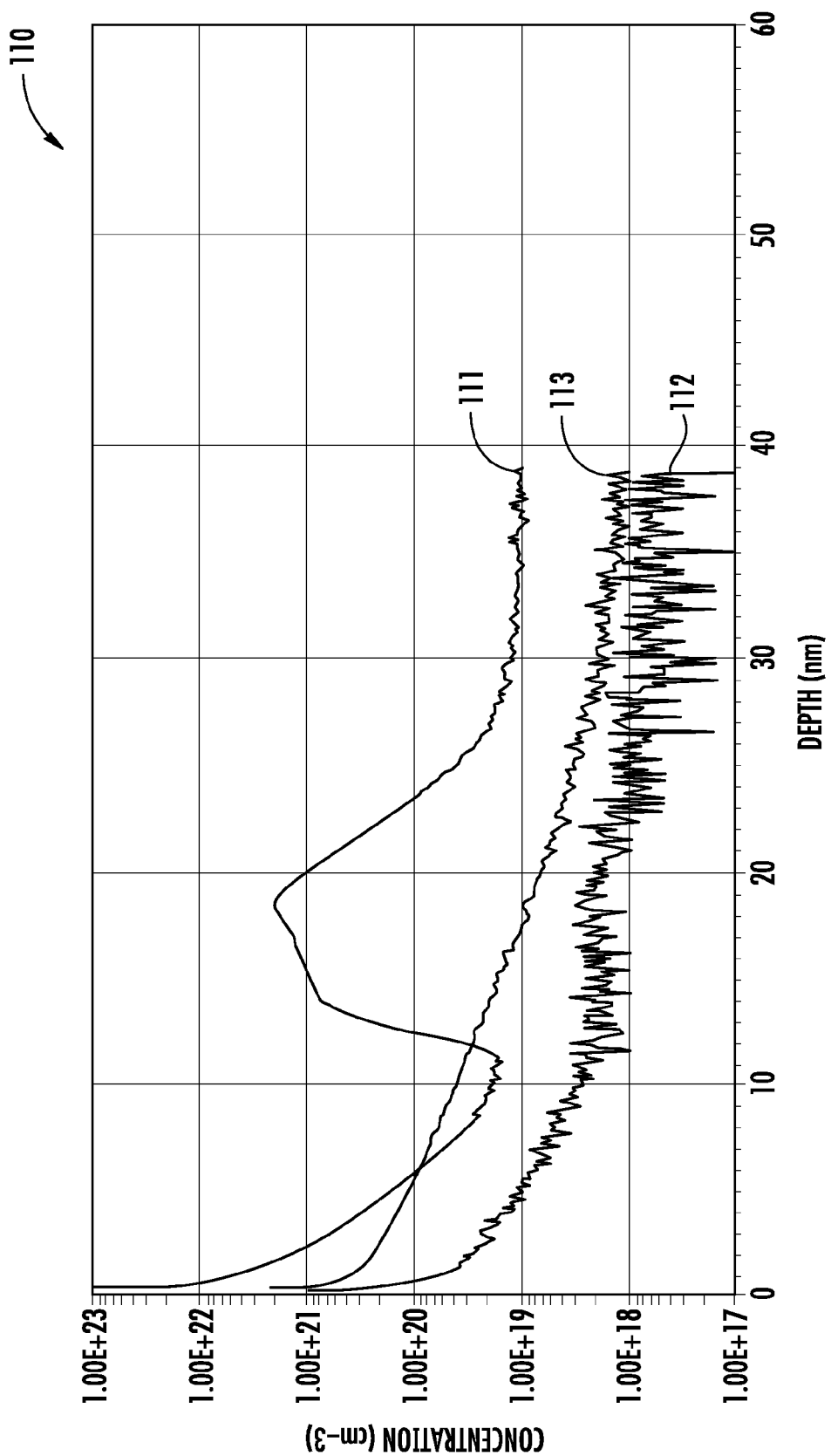

Another similar example is provided in the graph 110 of FIG. 11. Here, everything is the same as in the example of FIG. 10, except that smaller spacers (i.e., 16 Å) were used. Here, the oxygen concentration is represented by the plot 111, SiN concentration is represented by the plot 112, and carbon-12 is represented by the plot line 113.

Many modifications and other embodiments of the invention will come to the mind of one skilled in the art having the benefit of the teachings presented herein. Therefore, it is understood that the invention is not to be limited to the specific exemplary embodiments disclosed herein.

That which is claimed is:
1. A method for processing a semiconductor wafer in a single wafer processing chamber, the method comprising:
heating the single wafer processing chamber to a temperature in a range of 650-700° C.; and
forming at least one superlattice on the semiconductor wafer within the heated single wafer processing chamber by depositing silicon and oxygen to form a plurality of stacked groups of layers with each group of layers comprising a plurality of stacked base silicon monolayers defining a base silicon portion and at least one oxygen monolayer constrained within a crystal lattice of adjacent base silicon portions;
wherein depositing the oxygen comprises depositing the oxygen using an $N_2O$ gas flow, wherein the $N_2O$ gas flow comprises 0.1% to 10% $N_2O$ in a gas comprising He.

2. The method of claim 1 wherein depositing the oxygen comprises depositing the oxygen with an exposure time in a range of 1 to 100 seconds.

3. The method of claim 1 wherein the $N_2O$ gas flow is in a range of 10 to 5000 standard cubic centimeters per minute (SCCM).

4. The method of claim 1 wherein depositing the oxygen comprises depositing the oxygen at a pressure in a range of 10 to 100 Torr.

5. The method of claim 1 wherein a total dose of $N_2O$ is in a range of $1\times10^{14}$ to $7\times10^{14}$ atoms/cm$^2$ during the oxygen monolayer formation.

6. The method of claim 1 wherein the semiconductor wafer comprises a plurality of spaced apart shallow trench isolation (STI) regions, and wherein forming the at least one superlattice comprises selectively forming a respective superlattice between adjacent pairs of STI regions.

7. The method of claim 1 wherein forming the at least one superlattice comprises a blanket superlattice formation on the semiconductor wafer.

8. The method of claim 1 wherein at least some silicon atoms from opposing base silicon portions are chemically bound together through the at least one oxygen monolayer therebetween.

9. A method for processing a semiconductor wafer in a single wafer processing chamber, the semiconductor wafer comprising a plurality of spaced apart shallow trench isolation (STI) regions, the method comprising:
heating the single wafer processing chamber to a temperature in a range of 650-700° C.; and
selectively forming a respective superlattice between adjacent pairs of STI regions on the semiconductor wafer within the heated single wafer processing chamber by depositing silicon and oxygen to form a plurality of stacked groups of layers with each group of layers comprising a plurality of stacked base silicon monolayers defining a base silicon portion and at least one oxygen monolayer constrained within a crystal lattice of adjacent base silicon portions;
wherein depositing the oxygen comprises depositing the oxygen using an $N_2O$ gas flow and at a pressure in a range of 10 to 100 Torr, and wherein the $N_2O$ gas flow comprises 0.1% to 10% $N_2O$ in a gas comprising He.

10. The method of claim 9 wherein depositing the oxygen comprises depositing the oxygen with an exposure time in a range of 1 to 100 seconds.

11. The method of claim 9 wherein the $N_2O$ gas flow is in a range of 10 to 5000 standard cubic centimeters per minute (SCCM).

12. The method of claim 9 wherein a total dose of $N_2O$ is in a range of $1\times10^{14}$ to $7\times10^{14}$ atoms/cm$^2$ during the oxygen monolayer formation.

13. The method of claim 9 wherein at least some silicon atoms from opposing base silicon portions are chemically bound together through the at least one oxygen monolayer therebetween.

14. A method for processing a semiconductor wafer in a single wafer processing chamber, the method comprising:
heating the single wafer processing chamber to a temperature in a range of 650-700° C.; and
forming a blanket superlattice on the semiconductor wafer within the heated single wafer processing chamber by depositing silicon and oxygen to form a plurality of stacked groups of layers with each group of layers comprising a plurality of stacked base silicon monolayers defining a base silicon portion and at least one oxygen monolayer constrained within a crystal lattice of adjacent base silicon portions;
wherein depositing the oxygen comprises depositing the oxygen using an $N_2O$ gas flow and at a pressure in a range of 10 to 100 Torr, and wherein the $N_2O$ gas flow comprises 0.1% to 10% $N_2O$ in a gas comprising He.

15. The method of claim 14 wherein depositing the oxygen comprises depositing the oxygen with an exposure time in a range of 1 to 100 seconds.

16. The method of claim 14 wherein the $N_2O$ gas flow is in a range of 10 to 5000 standard cubic centimeters per minute (SCCM).

17. The method of claim 14 wherein a total dose of $N_2O$ is in a range of $1\times10^{14}$ to $7\times10^{14}$ atoms/cm$^2$ during the oxygen monolayer formation.

18. The method of claim 14 wherein at least some silicon atoms from opposing base silicon portions are chemically bound together through the at least one oxygen monolayer therebetween.

19. A method for processing a semiconductor wafer in a single wafer processing chamber, the method comprising:
heating the single wafer processing chamber to a temperature in a range of 650-700° C.; and
forming at least one superlattice on the semiconductor wafer within the heated single wafer processing chamber by depositing silicon and oxygen to form a plurality of stacked groups of layers with each group of layers comprising a plurality of stacked base silicon monolayers defining a base silicon portion and at least one oxygen monolayer constrained within a crystal lattice of adjacent base silicon portions;
wherein depositing the oxygen comprises depositing the oxygen using an $N_2O$ gas flow, and wherein the $N_2O$ gas flow comprises 0.1% to 10% $N_2O$ in a gas comprising Ar.

20. The method of claim 19 wherein depositing the oxygen comprises depositing the oxygen with an exposure time in a range of 1 to 100 seconds.

21. The method of claim 19 wherein the $N_2O$ gas flow is in a range of 10 to 5000 standard cubic centimeters per minute (SCCM).

22. The method of claim 19 wherein depositing the oxygen comprises depositing the oxygen at a pressure in a range of 10 to 100 Torr.

23. The method of claim 19 wherein a total dose of $N_2O$ is in a range of $1\times10^{14}$ to $7\times10^{14}$ atoms/cm$^2$ during the oxygen monolayer formation.

24. The method of claim 19 wherein the semiconductor wafer comprises a plurality of spaced apart shallow trench isolation (STI) regions, and wherein forming the at least one superlattice comprises selectively forming a respective superlattice between adjacent pairs of STI regions.

25. The method of claim 19 wherein forming the at least one superlattice comprises a blanket superlattice formation on the semiconductor wafer.

26. The method of claim 19 wherein at least some silicon atoms from opposing base silicon portions are chemically bound together through the at least one oxygen monolayer therebetween.

27. A method for processing a semiconductor wafer in a single wafer processing chamber, the method comprising:
heating the single wafer processing chamber to a temperature in a range of 650-700° C.; and
forming at least one superlattice on the semiconductor wafer within the heated single wafer processing chamber by depositing silicon and oxygen to form a plurality of stacked groups of layers with each group of layers comprising a plurality of stacked base silicon monolayers defining a base silicon portion and at least one oxygen monolayer constrained within a crystal lattice of adjacent base silicon portions;

wherein depositing the oxygen comprises depositing the oxygen using an $N_2O$ gas flow, and wherein a total dose of $N_2O$ is in a range of $1\times10^{14}$ to $7\times10^{14}$ atoms/cm$^2$ during the oxygen monolayer formation.

28. The method of claim 27 wherein depositing the oxygen comprises depositing the oxygen with an exposure time in a range of 1 to 100 seconds.

29. The method of claim 27 wherein the $N_2O$ gas flow is in a range of 10 to 5000 standard cubic centimeters per minute (SCCM).

30. The method of claim 27 wherein depositing the oxygen comprises depositing the oxygen at a pressure in a range of 10 to 100 Torr.

31. The method of claim 27 wherein the semiconductor wafer comprises a plurality of spaced apart shallow trench isolation (STI) regions, and wherein forming the at least one superlattice comprises selectively forming a respective superlattice between adjacent pairs of STI regions.

32. The method of claim 27 wherein forming the at least one superlattice comprises a blanket superlattice formation on the semiconductor wafer.

33. The method of claim 27 wherein at least some silicon atoms from opposing base silicon portions are chemically bound together through the at least one oxygen monolayer therebetween.

* * * * *